(12) United States Patent
Jo et al.

(10) Patent No.: US 8,489,043 B2
(45) Date of Patent: Jul. 16, 2013

(54) DISTORTION COMPENSATION APPARATUS AND APPARATUS AND METHOD FOR TRANSMITTING SIGNAL

(75) Inventors: Gweon-Do Jo, Daejeon-si (KR); Jung-Hoon Oh, Daejeon-si (KR); Joon-Hyung Kim, Daejeon-si (KR); Young-Hoon Kim, Daejeon-si (KR); Jae-Ho Jung, Daejeon-si (KR); Hyun-Kyu Chung, Daejeon-si (KR)

(73) Assignee: Electronics and Telecommunications Research Institute, Daejeon-Si (KR)

( * ) Notice: Subject to any disclaimer, the term of this patent is extended or adjusted under 35 U.S.C. 154(b) by 219 days.

(21) Appl. No.: 13/006,038

(22) Filed: Jan. 13, 2011

(65) Prior Publication Data
US 2012/0025909 A1    Feb. 2, 2012

(30) Foreign Application Priority Data
Jul. 28, 2010    (KR) .................. 10-2010-0073055

(51) Int. Cl.
*H04B 1/04*    (2006.01)
*H04K 3/00*    (2006.01)

(52) U.S. Cl.
USPC ...................................... 455/114.3; 375/296

(58) Field of Classification Search
USPC ................................ 455/114.3; 375/296, 297
See application file for complete search history.

(56) References Cited

U.S. PATENT DOCUMENTS
7,024,608 B2 *    4/2006    Kurokami ................... 714/746
2009/0207938 A1    8/2009    Jeong et al.
2009/0302940 A1 *    12/2009    Fuller et al. .................. 330/149

FOREIGN PATENT DOCUMENTS
KR    10-2009-0088484 A    8/2009
KR    10-2009-0089980 A    8/2009
KR    10-2009-0090766 A    8/2009

* cited by examiner

*Primary Examiner* — Lee Nguyen
(74) *Attorney, Agent, or Firm* — Kile Park Reed & Houtteman PLLC

(57) ABSTRACT

A distortion compensation apparatus and an apparatus and method for transmitting a signal are provided. The distortion compensation apparatus can extract precise distortion information by adding an additional signal to an input signal during the compensation of distortion in a nonlinear apparatus, and can linearize the nonlinear properties of the nonlinear apparatus using the distortion information. The apparatus for transmitting a signal can output a signal linearized by the same method as that used by the distortion compensation apparatus.

15 Claims, 7 Drawing Sheets

DISTORTION COMPENSATION APPARATUS AND APPARATUS AND METHOD FOR TRANSMITTING SIGNAL

CROSS-REFERENCE TO RELATED APPLICATION(S)

This application claims the benefit under 35 U.S.C. §119(a) of Korean Patent Application No. 10-2010-0073055, filed on Jul. 28, 2010, in the Korean Intellectual Property Office, the entire disclosure of which is incorporated herein by reference for all purposes.

BACKGROUND

1. Field

The following description relates to radio communication technology, and particularly, to compensating for the nonlinear properties of a radio communication-based nonlinear apparatus.

2. Description of the Related Art

Transmitters in radio communication systems amplify signals in consideration of is attenuation in radio channels, and transmit the amplified signals so that the signals can be properly received by receivers. The efficiency of power amplifiers, which amplify signals, can be improved by maintaining the linear relations between signals input to the power amplifiers and signals output from the power amplifiers. However, the power amplifiers of radio communication systems are generally nonlinear.

Since there is a limit in removing the nonlinear properties of nonlinear apparatuses all together, research has been conducted on ways to linearize nonlinear apparatuses with the use of peripheral devices such as pre-distorters, which linearize the output of nonlinear apparatuses by inverting the nonlinear properties thereof.

SUMMARY

The following description relates to radio communication technology for extracting precise distortion information during the compensation of distortion in a nonlinear apparatus, linearizing the nonlinear apparatus using the extracted distortion information and enabling the nonlinear apparatus to transmit linear signals.

In one general aspect, there is provided a distortion compensation apparatus for compensating for the nonlinear properties of a radio communication-based nonlinear apparatus, the distortion compensation apparatus including: a controller adding an additional signal to an input signal, predistorting the input signal added with the additional signal, and controlling the nonlinear apparatus to output a linear signal using the predistorted signal.

In another general aspect, there is provided an apparatus for transmitting a signal, which can output a linear, amplified signal by compensating the nonlinear properties of a transmission path, the apparatus including: a forward path circuit which comprises an additional signal applier adding an additional signal to a digital input signal, a predistorter predistorting the input signal is added with the additional signal, a digital-to-analog converter converting the predistorted signal into an analog signal, a power amplifier amplifying the analog signal and a transmitting antenna outputting the amplified signal; and a feedback path circuit which comprises a digital-to-analog converter converting the amplified signal into a digital signal and an adaptive controller providing distortion information, which is necessary for predistortion performed by the predistorter, to the predistorter.

In another general aspect, there is provided a method of transmitting signal, which can output a linear, amplified signal by compensating the nonlinear properties of a transmission path, the method including: adding an additional signal to a digital input signal; predistorting the input signal added with the additional signal; converting the predistorted signal into an analog signal; amplifying the analog signal and outputting the amplified signal; converting the amplified signal into a digital signal; and reflecting distortion information, which is necessary for predistortion, in the predistorting of the input signal added with the additional signal.

Other features and aspects may be apparent from the following detailed description, the drawings, and the claims.

Figure 1:
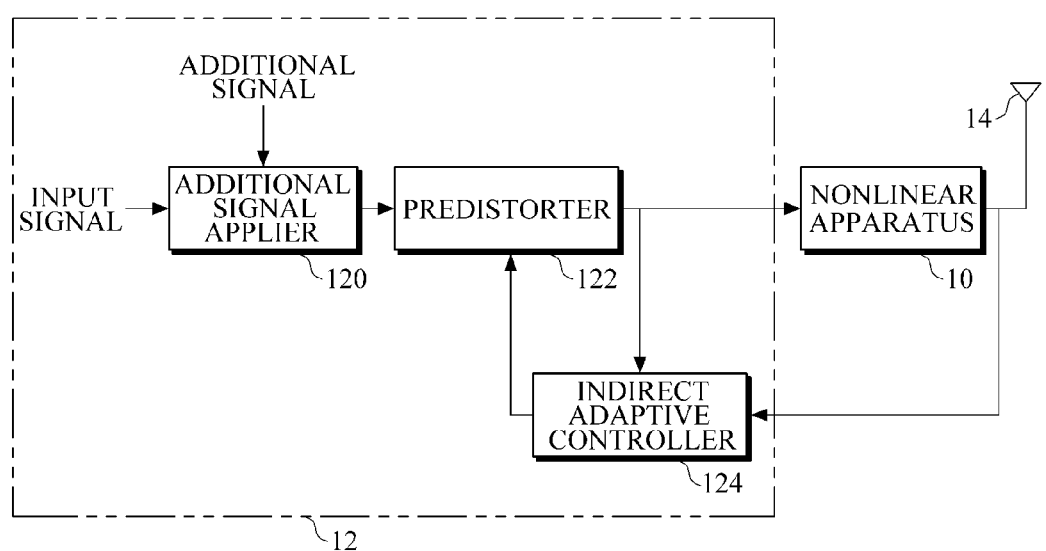
FIG. 1 is a block diagram of an example distortion compensation apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a block diagram of an example distortion compensation apparatus 12. Referring to FIG. 1, the distortion compensation apparatus 12 may compensate for the nonlinear properties of a non-linear apparatus 10 for radio communication. The non-linear apparatus 10 may output a signal linearized by the distortion compensation apparatus 12 through a transmitting antenna 14. Examples of the nonlinear apparatus 10 include, but are not restricted to, a power amplifier, and particularly, a high-power amplifier (HPA). HPAs are a type of radio frequency (RF) power amplifier that can be employed in a radio communication system using RF signals. In general, efficiency is considered more important than noise when determining the performance of HPAs.

Power amplifiers used in a radio communication system, and particularly, HPAs, operate near a nonlinear operating point in order to achieve high efficiency. However, the nonlinearity of power amplifiers adversely affects the performance of a whole radio communication system, and this problem cannot be solved easily. Thus, it is desirable to design an apparatus capable of achieving near-linear performance.

The distortion compensation apparatus 12 may use predistortion to compensate for the nonlinear properties of the nonlinear apparatus 10. More specifically, the distortion compensation apparatus 12 may use digital predistortion (DPD) in order to deliver high efficiency at low cost. DPD can linearize the output of the nonlinear apparatus 10 by inverting the nonlinearity of the nonlinear apparatus 12.

Referring to FIG. 1, the distortion compensation apparatus 12 may include an additional signal applier 120, a predistorter 122 and an indirect adaptive controller 124.

The additional signal applier 120 may add an additional signal to an input signal. The input signal may be a digital sub-band signal. The input signal may be a combination of samples of a current input signal and samples of a previous input signal previously processed by the distortion compensation apparatus 12. The input signal may also be a combination of the samples of the current input signal and samples of a signal previously predistorted by the distortion compensation apparatus 12.

The additional signal may be a noise signal whose level is equivalent to a noise floor that may be generated during the transmission of a signal through the nonlinear apparatus 10. The additional signal may be added to the input signal in order to remove the influence of a noise floor on the operation of the distortion compensation apparatus 12, and this will be described later in further detail. Since the power of the additional signal is much lower than the power of the input signal, the influence of the additional signal on the quality of radio communication may be ignored.

The predistorter 122 may predistort the input signal added with the additional signal, and is may transmit the predistorted signal to the nonlinear apparatus 10. The predistorter 122 may use DPD.

The indirect adaptive controller 124 may extract distortion information, which is necessary for predistortion performed by the predistorter 122, from the predistorted signal provided by the predistorter 122 and an output signal of the nonlinear apparatus 10, and may transmit the distortion information to the predistorter 122 via a feedback path circuit. More specifically, the indirect adaptive controller 124 may extract the distortion information by reflecting a noise floor that may be generated during the conversion of the predistorted signal into an analog signal.

The indirect adaptive controller 124 may use various adaptive algorithms such as a recursive least square (RLS) algorithm, a least squares (LS) algorithm, or a least median of squares (LMS) algorithm in order to properly extract the distortion information.

A digital input signal input to a digital radio communication system may be predistorted by the predistorter 122. Then, additional digital signal processing may be performed on the predistorted signal, if necessary. Thereafter, a signal obtained by the additional digital signal processing may be converted into an analog signal by a digital-to-analog converter (DAC). The analog signal may be converted into an RF signal by an analog RF device. The RF signal may be input to the nonlinear apparatus 10.

If the above-mentioned structure of the digital radio communication system is implemented as a hardware device, the performance of the digital radio communication system may deteriorate due to, for example, mutual interference between elements of the DAC and the analog RF device, thermal noise or the nonlinearity of each constituent of the digital radio communication system.

The nonlinearity of an analog device may be compensated for, at least partially, by the indirect adaptive controller 124. However, the influence of a noise floor generated by the DAC during the conversion of a digital signal into an analog signal may not be properly compensated for because it is impossible to artificially generate a signal that can offset a noise floor generated due to thermal noise having random properties. A noise floor may be generated due to thermal noise inherent in the DAC, quantization noise and nonlinearity.

In this exemplary embodiment, the influence of a noise floor generated in the DAC during the extraction of the distortion information by the indirect adaptive controller 124 can be removed by adding up the input signal and the additional signal with the use of the additional signal applier 120. That is, the additional signal applier 120 may add the additional signal, which is a type of noise signal whose level is equivalent to the noise floor generated in the DAC, to the input signal and may transmit a signal obtained by the addition to the predistorter 122. The predistorter 122 may predistort the signal transmitted by the additional signal applier 120, and may transmit the predistorted signal to the DAC. Thereafter, the DAC may convert the predistorted signal into an analog signal and may transmit the analog signal to the indirect adaptive controller 124 via a feedback path circuit. The indirect adaptive controller 124 may correct the analog signal provided by the DAC for distortion information calculation error by as much as the noise floor generated in the DAC. Therefore, the nonlinear apparatus 10 can output a linear signal with the influence of a noise floor removed therefrom.

Figure 2:
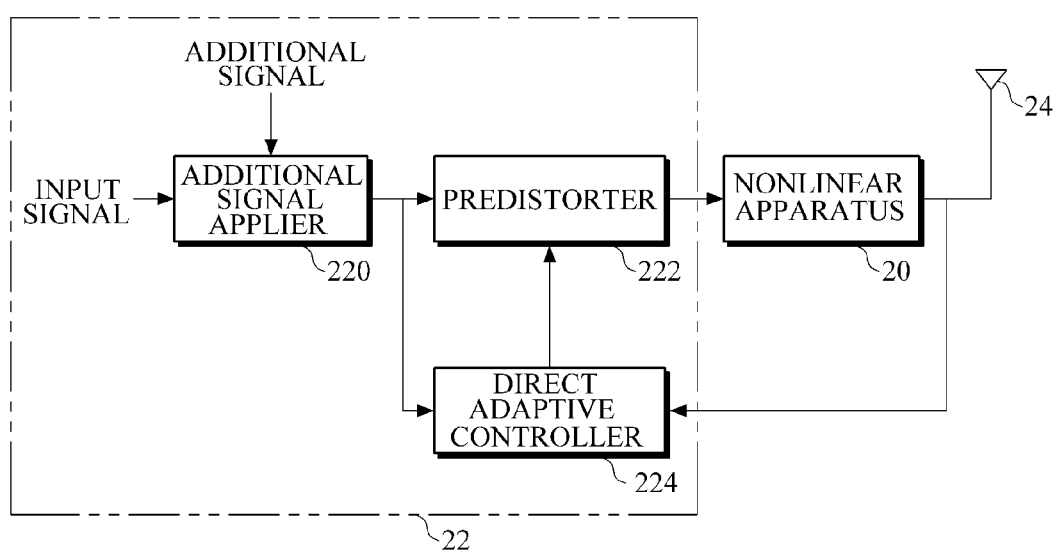
FIG. 2 is a block diagram of another example distortion compensation apparatus.

FIG. 2 is a block diagram of another example distortion compensation apparatus 22. Referring to FIG. 2, the distortion compensation apparatus 22 may include an additional signal applier 220, a predistorter 222 and a direct adaptive controller 224.

The additional signal applier 220 may add an additional signal to an input signal. The input signal may be a digital sub-band signal. The additional signal may be a noise signal whose level is equivalent to a noise floor that may be generated during the transmission of a signal by a nonlinear apparatus 20. The additional signal may be added to the input signal in order to remove the noise floor. Since the power of the additional signal is much lower than the power of the input signal, the influence of the additional signal on the quality of radio communication may be ignored.

The additional signal applier 220 may remove the influence of a noise floor generated in a DAC during the extraction of distortion information by the direct adaptive controller 224. That is, the additional signal applier 220 may add the additional signal, which has a level equivalent to the noise floor generated in the DAC, to the input signal and may transmit a signal obtained by the addition to the predistorter 222. The predistorter 222 may predistort the signal provided by the additional signal applier 220 and may transmit the predistorted signal to the DAC. Then, the DAC may convert the predistorted signal into an analog signal and may transmit the analog signal to the direct adaptive controller 224 via a feedback path circuit. The direct adaptive controller 224 may correct the analog signal provided by the DAC for distortion information calculation error by as much as the noise floor generated in the DAC. Therefore, the nonlinear apparatus 20 can output a linear signal with the influence of a noise floor removed therefrom.

More specifically, the predistorter 222 may predistort input signal added with the additional signal and may transmit the predistorted signal to the nonlinear apparatus 20. The predistorter 222 may use DPD.

The direct adaptive controller 224 may extract distortion information, which is necessary for predistortion performed by the predistorter 222, from an output signal of the nonlinear apparatus 20 and the input signal added with the additional signal, and may transmit the distortion information to the predistorter 222. More specifically, the direct adaptive controller 224 may extract the distortion information by reflecting a noise floor that may be generated during the conversion of the predistorted signal into an analog signal.

Figure 3:
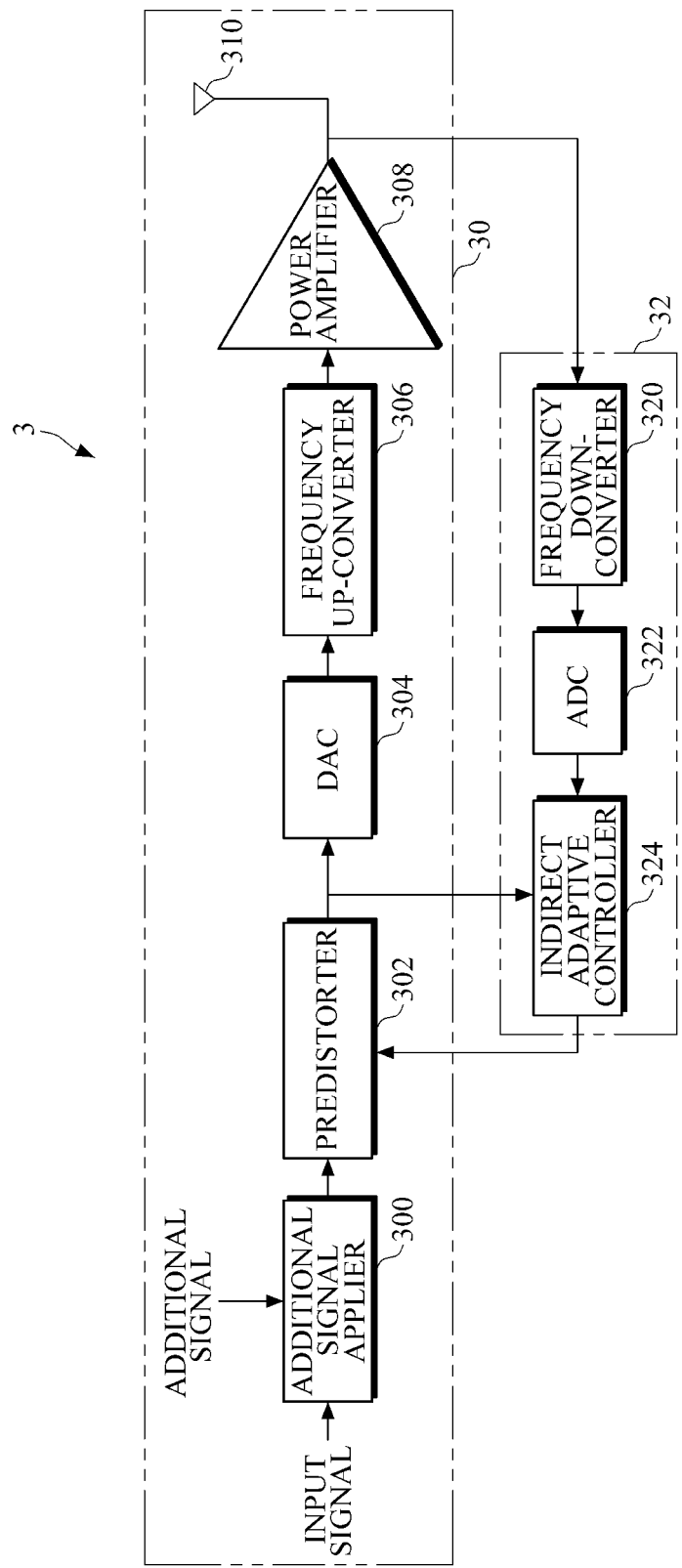
FIG. 3 is a block diagram of an example apparatus for transmitting a signal.

FIG. 3 is a block diagram of an example apparatus 3 for transmitting a signal. Referring to FIG. 3, the apparatus 3 may include a forward path circuit 30 and a feedback path circuit 32.

The forward path circuit 30 may include an additional signal applier 30, a predistorter 302, a digital-to-analog converter (DAC) 304, a frequency up-converter 306, a power amplifier 308 and a transmitting antenna 310. The forward path circuit 30 may also include a digital modulator (not shown), which modulates a predistorted digital signal and is disposed between the predistorter 302 and the DAC 304.

The feedback path circuit 32 may include a frequency down-converter 320, an analog-to-digital converter (ADC) 322, and an indirect adaptive controller 324. The feedback path circuit 32 may also include a digital demodulator (not shown), which demodulates a digital signal provided by the ADC 322 and is disposed between the ADC 322 and the indirect adaptive controller 324.

In a radio communication system using orthogonal frequency division multiplexing (OFDM), a digital input signal input to the additional signal applier 300 may be a sub-band signal having an in-phase component I and a quadrature component Q. An additional signal, which is added to the input signal, may be a noise signal whose level is equivalent to a noise floor generated during the conversion of a predistorted signal provided by the predistorter 302 into an analog signal by the DAC 304. Since the power of the additional signal is much lower than the power of the input signal, the influence of the additional signal on the quality of radio communication may be ignored.

The predistorter 302 may predistort the input signal added with the additional signal, in is order to compensate for distortion that may occur in the power amplifier 308. More specifically, the predistorter 302 may use a complex polynomial and/or a lookup table (LUT) in order to compensate for the nonlinear properties of the power amplifier 308. For example, the predistorter 302 may calculate various predistortion gains for a possible range of amplitudes that the input signal may have by using polynomial coefficients that model the inverse nonlinear distortion properties of the power amplifier 308, and may store the calculated predistortion gains in an LUT.

The digital modulator may convert the input signal into a single digital signal using quadrature modulation. The DAC 304 may convert the digital signal provided by the digital modulator into an analog signal. The frequency up-converter 306 may convert the analog signal provided by the DAC into an RF signal, which is a high-frequency signal within the frequency band of the corresponding radio communication system. The power amplifier 308 may amplify the RF signal and may transmit the amplified RF signal to the transmitting antenna 310. Therefore, the amplified RF signal may be output through the transmitting antenna 310. In short, the input signal added with the additional signal may be linearized through distortion compensation performed by the feedback path circuit 32, and the linearized signal may be output through the transmitting antenna 310. Distortion compensation performed by the feedback path circuit 32 will be described later in further detail.

The feedback path circuit 32 may monitor the signal amplified by the power amplifier 308. The frequency down-converter 320 may receive part of the signal transmitted from the power amplifier 308 to the transmitting antenna 310. The operation of the frequency down-converter 320 may be opposite to the operation of the frequency up-converter 306. The frequency down-converter 320 may lower the frequency of an RF signal amplified by the power amplifier 308 to a sub-band frequency level.

The ADC 322 may convert the sub-band frequency signal provided by the frequency down-converter 420 into a digital signal. The digital demodulator may demodulate the digital signal provided by the ADC 322 into an in-phase component and a quadrature component by inversely performing the operation of the digital modulator in synchronization with a reference clock. Thereafter, the digital demodulator may transmit the in-phase component and the quadrature component to the indirect adaptive controller 324.

The indirect adaptive controller 324 may periodically monitor the output of the predistorter 302, i.e., a predistorted signal. More specifically, the indirect adaptive controller 324 may receive a predistorted signal provided by the predistorter 302 and an output signal of the DAC 322, which is a signal to be actually transmitted. Thereafter, the indirect adaptive controller 324 may extract distortion information, which is necessary for predistortion performed by the predistorter 302, from the predistorted signal provided by the predistorter 302 and the digital signal provided by the DAC 322, and may transmit the distortion information to the predistorter 302.

For example, the indirect adaptive controller 324 may determine coefficients of a predistortion polynomial based on the predistorted provided by the predistorter 302 and the digital signal provided by the DAC 322 and may calculate various predistortion gains for a possible range of amplitudes that an input signal may have using the determined polynomial coefficients, and may store the calculated predistortion gains in an LUT present in the predistorter 302.

When no additional signal is added to the input signal, as in the case of the prior art, distortion information calculation error, which amounts to a noise floor generated in the DAC 304 during the calculation of the distortion information by the indirect adaptive controller 324, may be generated. However, according to the present invention, since the additional signal is applier 320 adds an additional signal to an input signal, the distortion information calculation error can be corrected.

Figure 4:
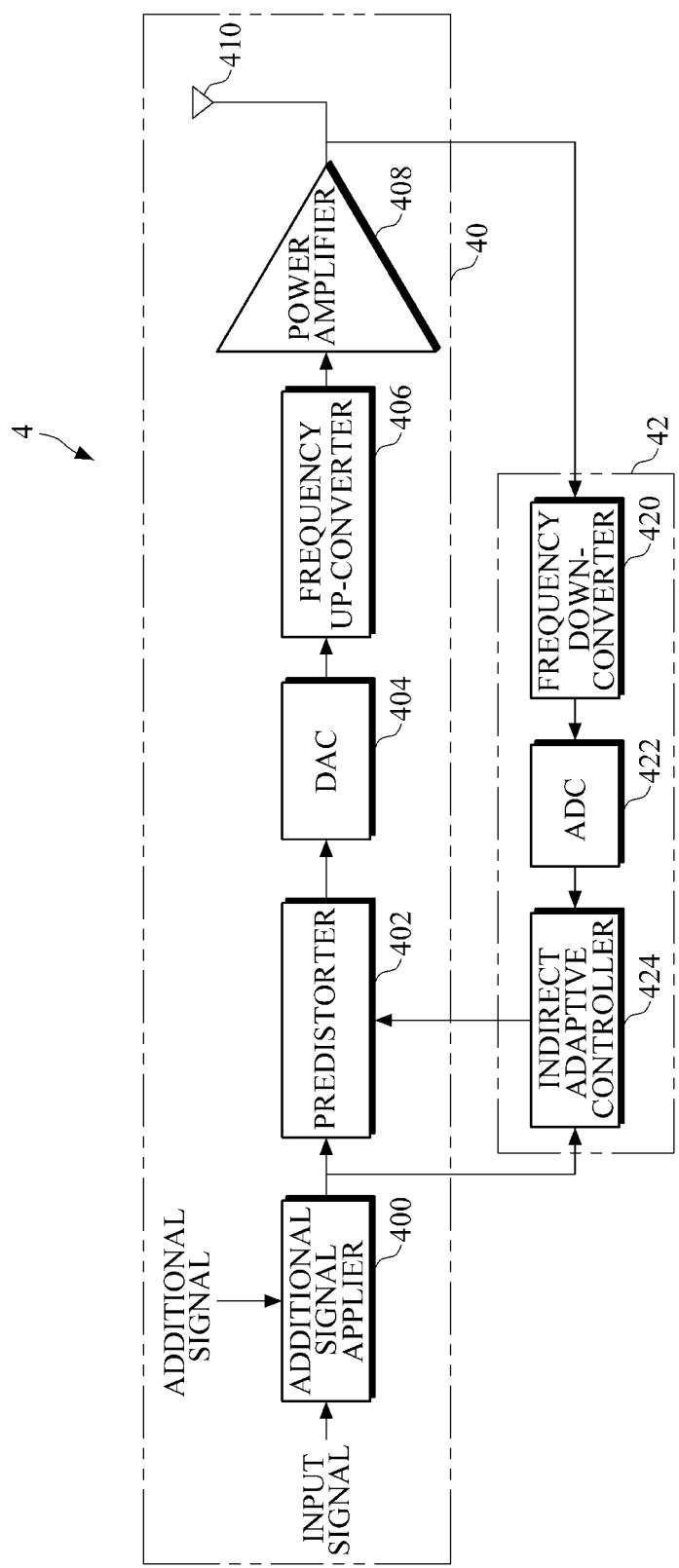
FIG. 4 is a block diagram of another example apparatus for transmitting a signal.

FIG. 4 is a block diagram of another example apparatus 4 for transmitting a signal. Referring to FIG. 4, the apparatus 4 may include a forward path circuit 40 and a feedback path circuit 42.

The forward path circuit 40 may include an additional signal applier 400, a predistorter 402, a DAC 404, a frequency up-converter 406, a power amplifier 408, and a transmitting antenna 410. The forward path circuit 40 may also include a digital modulator (not shown), which is disposed between the predistorter 402 and the DAC 404 and modulates a predistorted digital signal.

The feedback path circuit 42 may include a frequency down-converter 420, an ADC 422 and a direct adaptive controller 424. The feedback path circuit 42 may also include a digital demodulator (not shown), which demodulates a digital signal and is disposed between the ADC 422 and the direct adaptive controller 424.

A digital input signal that can be input to the additional signal applier 400 may be a sub-band signal having an in-phase component and a quadrature component. An additional signal that can be added to the input signal, may be a noise signal whose level is equivalent to a noise floor generated during the conversion of a predistorted digital signal provided by the predistorter 402 into an analog signal. Since the power of the additional signal is much lower than the power of the input signal, the influence of the additional signal on the quality of radio communication may be ignored.

The predistorter 402 may predistort the input signal added with the additional signal, and may transmit the predistorted signal to the modulator. The modulator may modulate the predistorted signal and may transmit the modulated signal to the DAC 404. The DAC 404 may is convert the modulated signal into an analog signal. The frequency up-converter 406 may convert the analog signal into an RF signal, which is a high-frequency signal within the frequency band of a corresponding radio communication system. The power amplifier 408 may amplify the RF signal and may transmit the amplified RF signal to the transmitting antenna 410. In short, the input signal added with the additional signal may be linearized through distortion compensation performed by the feedback path circuit 42, and the linearized signal may be output through the transmitting antenna 310. Distortion compensation performed by the feedback path circuit 42 will be described later in further detail.

The feedback path circuit 42 may monitor the signal amplified by the power amplifier 408. The frequency down-converter 420 may receive part of the signal transmitted from the power amplifier 408 to the transmitting antenna 410. The operation of the frequency down-converter 420 may be opposite to the operation of the frequency up-converter 406. The frequency down-converter 420 may lower the frequency of an RF signal amplified by the power amplifier 408 to a sub-band frequency level.

The ADC 422 may convert the sub-band frequency signal provided by the frequency down-converter 420 into a digital signal. The digital demodulator may demodulate the digital signal provided by the ADC 322 into an in-phase component and a quadrature component by inversely performing the operation of the digital modulator in synchronization with a reference clock. Thereafter, the digital demodulator may transmit the in-phase component and the quadrature component to the direct adaptive controller 424.

The direct adaptive controller 424 may extract distortion information, which is necessary for predistortion performed by the predistorter 402, from the input signal added with the additional signal and from the digital signal provided by the ADC 422 and may transmit the distortion information to the predistorter 402.

When no additional signal is added to the input signal, as in the case of the prior art, distortion information calculation error, which amounts to a noise floor generated in the DAC 404 during the calculation of the distortion information by the direct adaptive controller 424, may be generated. However, according to the present invention, since the additional signal applier 420 adds the additional signal to the input signal, the distortion information calculation error can be corrected.

Figure 5:
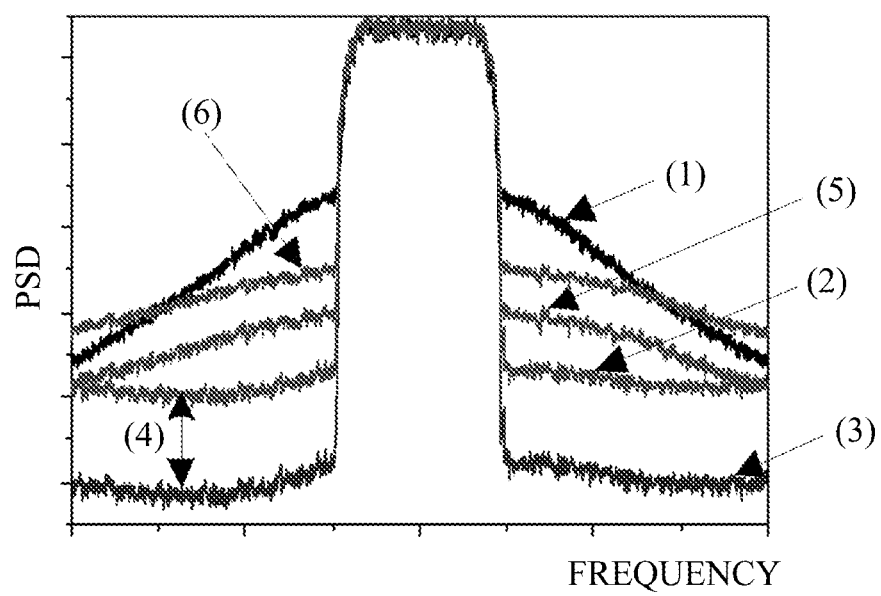
FIG. 5 is a diagram illustrating variations in an output spectrum upon pre-distortion.

FIG. 5 is a diagram showing variations in an output spectrum of the apparatus 3 or 4. Referring to FIG. 5, the X-axis represents frequency, and the Y-axis represents power spectral density (PSD). For convenience, the following description will be specifically directed to the apparatus 3, although it will be understood to those skilled in the art that the present invention can directly apply to the apparatus 4.

Referring to FIG. 5, reference numeral (1) represents an output signal of the power amplifier 308 when not using the predistorter 302, reference numeral (2) represents a signal obtained by predistorting the input signal (3) with the use of the predistorter 302 and converting the predistorted input signal into an analog signal with the use of the DAC 304, and reference numeral (3) represents an input signal. The signal (2) may have an increased noise floor, compared to that of the input signal (3).

More specifically, a signal obtained by typical digital processing, i.e., the input signal (3), generally has a very low noise floor, whereas the analog signal provided by the DAC 304, i.e., the signal (2), has an increased noise floor, compared to that of the input signal (3). This problem, however, cannot be avoided or solved easily.

The indirect adaptive controller 324 may extract distortion information from the input signal (3) and the output signal (1) of the power amplifier 308. However, since the signal (2) is is already erroneous by an amount represented by reference numeral (4), the output signal (1) of the power amplifier 308 may inevitably suffer from as much calculation error as the amount represented by reference numeral (4). This calculation error cannot be removed entirely even if the distortion information is applied to predistortion performed by the predistorter 302.

According to the present invention, the above-mentioned problem can be addressed by adding a noise signal having almost the same noise floor as the signal (2) to the input signal (3). More specifically, reference numeral (6) represents the result of performing nonlinearity compensation on the signal (2), which is already erroneous by the amount represented by reference numeral (4), with the use of the indirect adaptive controller 324 without adding any additional to the input signal (3). If an additional signal having almost the same noise floor as the signal (2) is added to the predistorted input signal provided by the predistorter 302, the spectrum of an output signal of the DAC 304 may become similar to that of the signal (2), and a signal (5) may be acquired as the result of performing nonlinearity compensation with the use of the indirect adaptive controller 324. The signal (5) has an improved adjacent channel power ratio (ACPR), compared to that of the signal (6).

Figure 6:
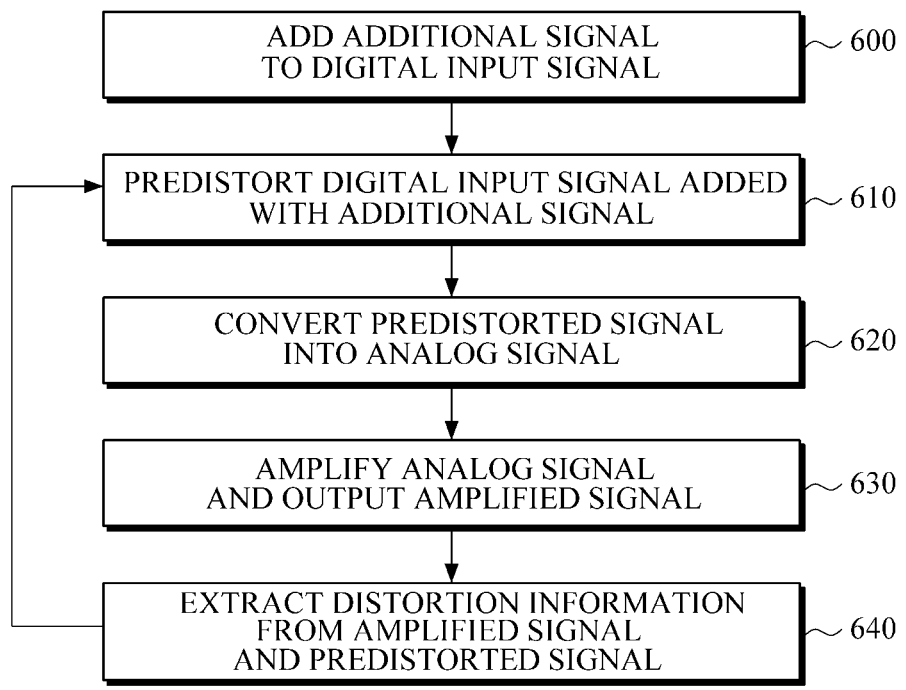
FIG. 6 is a flowchart of an example method of transmitting a signal.

FIG. 6 is a flowchart of an example method of transmitting a signal. Referring to FIG. 6, in order to output a linear, amplified signal through the compensation of the nonlinear properties of a transmission path, an apparatus for transmitting a signal may receive a digital input signal and add an additional signal to the digital input signal (600). The additional signal may be a noise signal whose level is equivalent to a noise floor that may be generated during the conversion of a predistorted digital signal into an analog signal.

Thereafter, the apparatus may predistort the digital input signal added with the additional signal (610). Thereafter, the apparatus may convert the predistorted signal into an analog signal (620). Thereafter, the apparatus may amplify the analog signal and output the amplified signal is (630). Thereafter, the apparatus may extract distortion information, which is necessary for predistortion, from the amplified signal and the predistorted signal and may apply the distortion information to the predistortion of the digital input signal added with the additional signal (640).

Figure 7:
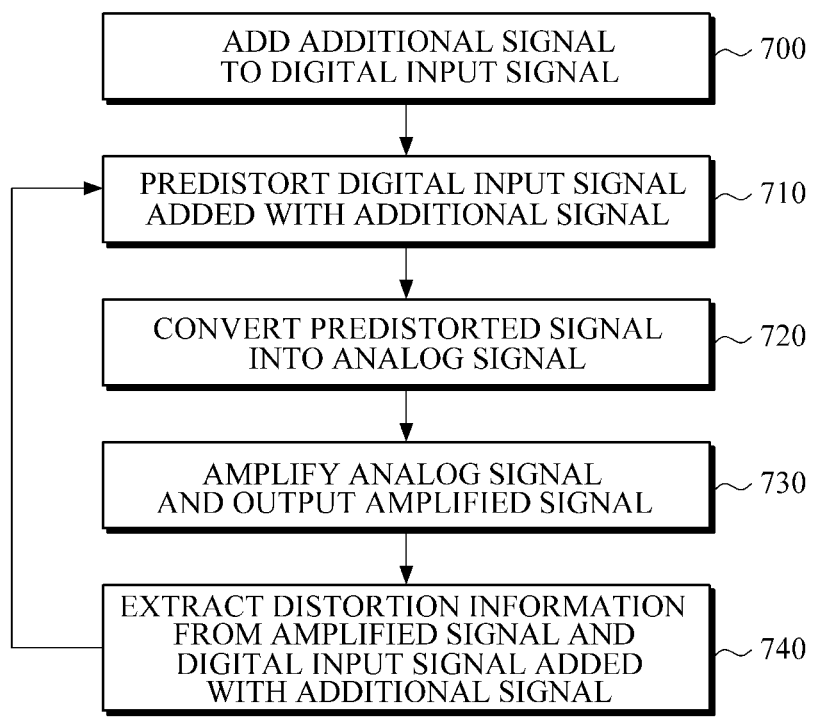
FIG. 7 is a flowchart of another example method of transmitting a signal.

FIG. 7 is a flowchart of another method of transmitting a signal. Referring to FIG. 7, in order to output a linear, amplified signal through the compensation of the nonlinear properties of a transmission path, an apparatus for transmitting a signal may receive a digital input signal and add an additional signal to the digital input signal (700). The additional signal may be a noise signal whose level is equivalent to a noise floor that may be generated during the conversion of a predistorted digital signal into an analog signal.

Thereafter, the apparatus may predistort the digital input signal added with the additional signal (710). Thereafter, the apparatus may convert the predistorted signal into an analog signal (720). Thereafter, the apparatus may amplify the analog signal and output the amplified signal (730). Thereafter, the apparatus may extract distortion information, which is necessary for predistortion, from the amplified signal and the input signal added with the additional signal and may apply the distortion information to the predistortion of the digital input signal added with the additional signal (740).

According to the present invention, it is possible to extract precise distortion information by adding an additional signal to an input signal during the compensation of distortion in a nonlinear apparatus. In addition, it is possible to linearize the nonlinear properties of the nonlinear apparatus using the distortion information and thus to transmit linear signals. That is, it is possible to address the problem of the deterioration of the performance of the nonlinear apparatus due to calculation error that may be generated because of an increased noise floor, which can be caused by thermal noise, quantization or the nonlinearity of the nonlinear device is during the extraction of the distortion information. Since the power of the additional signal is much lower than the power of the input signal, the influence of the additional signal on the input signal is ignorable. The additional signal can even improve the nonlinearity of the nonlinear apparatus.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other is implementations are within the scope of the following claims.

What is claimed is:

1. A distortion compensation apparatus for compensating for the nonlinear properties of a radio communication-based nonlinear apparatus, the distortion compensation apparatus comprising:
a controller adding an additional signal to a non-training input signal, predistorting the non-training input signal added with the additional signal, converting the predistorted signal into an analog signal, and controlling the nonlinear apparatus to output a linear signal using the analog signal,
wherein the additional signal is a noise signal whose level is equivalent to a noise floor generated during the converting the predistorted signal into the analog signal.

2. The distortion compensation apparatus of claim 1, wherein the nonlinear apparatus is a power amplifier.

3. The distortion compensation apparatus of claim 1, wherein the controller comprises:
an additional signal applier adding the additional signal to the non-training input signal;
a predistorter predistorting the non-training input signal added with the additional signal and transmitting the predistorted signal to the nonlinear apparatus; and
an indirect adaptive controller extracting distortion information, which is necessary for predistortion performed by the predistorter, from an output signal of the nonlinear apparatus and the predistorted signal and transmitting the distortion information to the predistorter.

4. The distortion compensation apparatus of claim 3, wherein the indirect adaptive controller extracts the distortion information by reflecting the noise floor generated during the converting the predistorted signal into the analog signal.

5. The distortion compensation apparatus of claim 1, wherein the controller comprises:
an additional signal applier adding the additional signal to the non-training input signal;
a predistorter predistorting the non-training input signal added with the additional signal and transmitting the predistorted signal to the nonlinear apparatus; and
a direct adaptive controller extracting distortion information, which is necessary for predistortion performed by the predistorter, from an output signal of the nonlinear apparatus and the input signal added with the additional signal, and transmitting the distortion information to the predistorter.

6. The distortion compensation apparatus of claim 5, wherein the direct adaptive controller extracts the distortion information by reflecting the noise floor generated during the converting the predistorted signal into the analog signal.

7. The distortion compensation apparatus of claim 1, wherein the non-training input signal is a combination of samples of the non-training input signal and samples of a previous non-training input signal previously processed by the distortion compensation apparatus.

8. The distortion compensation apparatus of claim 1, wherein the non-training input signal is a combination of samples of the non-training input signal and samples of a signal previously predistorted by the distortion compensation apparatus.

9. An apparatus for transmitting a signal, which can output a linear, amplified signal by compensating the nonlinear properties of a transmission path, the apparatus comprising:
a forward path circuit which comprises an additional signal applier adding an additional signal to a non-training digital input signal, a predistorter predistorting the non-training digital input signal added with the additional signal, a digital-to-analog converter converting the predistorted signal into an analog signal, a power amplifier amplifying the analog signal, and a transmitting antenna outputting the amplified signal; and
a feedback path circuit which comprises a digital-to-analog converter converting the amplified signal into a digital signal and an adaptive controller providing distortion information, which is necessary for predistortion performed by the predistorter, to the predistorter, wherein the additional signal is a noise signal whose level is equivalent to a noise floor generated during the converting the predistorted signal into the analog signal by the digital-to-analog converter.

10. The apparatus of claim 9, wherein the adaptive controller extracts the distortion information from the predistorted signal and the digital signal provided by the analog-to-digital converter and transmits the distortion information to the predistorter.

11. The apparatus of claim 9, wherein the adaptive controller extracts the distortion information from the digital signal provided by the analog-to-digital converter and the non-training digital input signal added with the additional signal, and transmits the distortion information to the predistorter.

12. The apparatus of claim 9, wherein the forward path circuit further comprises a frequency up-converter converting the analog signal provided by the digital-to-analog converter into a radio frequency (RF) signal and transmitting the RF signal to the power amplifier, and the feedback path circuit further comprises a frequency down-converter converting the amplified signal provided by the power amplifier into a sub-band signal and transmitting the sub-band signal to the adaptive controller.

13. A method of transmitting a signal, which can output a linear, amplified signal by compensating the nonlinear properties of a transmission path, the method comprising:
    adding an additional signal to a non-training digital input signal;
    predistorting the non-training digital input signal added with the additional signal;
    converting the predistorted signal into an analog signal;
    amplifying the analog signal and outputting the amplified signal;
    converting the amplified signal into a digital signal; and
    reflecting distortion information, which is necessary for predistortion, in the predistorting the non-training digital input signal added with the additional signal,
    wherein the additional signal is a noise signal whose level is equivalent to a noise floor generated during the converting the predistorted signal into the analog signal.

14. The method of claim 13, wherein the reflecting the distortion information comprises extracting distortion information from the predistorted signal and the digital signal obtained by the converting the amplified signal, and reflecting the extracted distortion information in the predistorting the non-training digital input signal added with the additional signal.

15. The method of claim 13, wherein the reflecting the distortion information comprises extracting distortion information from the digital signal obtained by the converting the amplified signal and the non-training digital input signal added with the additional signal and reflecting the extracted distortion information in the predistorting the non-training digital input signal added with the additional signal.

* * * * *